United States Patent
Naum et al.

(10) Patent No.: US 7,919,011 B2
(45) Date of Patent: Apr. 5, 2011

(54) LED AND ITS FLUORESCENT POWDER

(75) Inventors: Soshchin Naum, Changhua (TW); Wei-Hung Lo, Taipei (TW); Chi-Ruei Tsai, Taipei (TW)

(73) Assignee: Chen Shia-Meng Tsai (TW)

( * ) Notice: Subject to any disclaimer, the term of this patent is extended or adjusted under 35 U.S.C. 154(b) by 689 days.

(21) Appl. No.: 11/984,582

(22) Filed: Nov. 20, 2007

(65) Prior Publication Data

US 2008/0116422 A1    May 22, 2008

(51) Int. Cl.
*C09K 11/80* (2006.01)
(52) U.S. Cl. .................................. 252/301.4 R
(58) Field of Classification Search ............ 252/301.4 R
See application file for complete search history.

(56) References Cited

U.S. PATENT DOCUMENTS

| 6,596,195 B2 * | 7/2003 | Srivastava et al. ..... 252/301.4 R |
| 6,753,646 B1 * | 6/2004 | Liu et al. ....................... 313/512 |

FOREIGN PATENT DOCUMENTS

WO    WO 2006/129228    * 12/2006

* cited by examiner

*Primary Examiner* — C. Melissa Koslow
(74) *Attorney, Agent, or Firm* — The Weintraub Group, P.L.C.

(57) ABSTRACT

A fluorescent powder using YAG (yttrium aluminum garnet) as the substrate and cerium as the excitant, and having added thereto Tb (terbium) ions, Ga (gallium) ions, Yb (ytterbium) ions and Lu (lutetium) ions. The YAG (yttrium aluminum garnet) has the chemical formula of $(Y_{1-x-y-z-p-q}Gd_xTb_yYb_zLu_pCe_q)_3Al_5O_{12}$. The invention also provides an organic film layer using the fluorescent powder, and a LED using the organic film layer.

6 Claims, 1 Drawing Sheet

LED AND ITS FLUORESCENT POWDER

BACKGROUND OF THE INVENTION

1. Field of the Invention

The present invention relates to light emitting technology and more particularly, to a LED and its fluorescent powder and organic film layer. The LED has covered thereon an organic film layer containing a fluorescent powder that has added thereto Tb (terbium) ions, Gd (gadolinium) ions, Yb (ytterbium) ions and Lu (lutetium) ions. The fluorescent powder absorbs short-wave radiation $\lambda=440\sim480$ nm from an InGaN semiconductor heterostructure and then radiates light of peak wavelength $\lambda=525\sim595$ nm.

2. Description of the Related Art

In the development of lighting sources, white light is a blend of all the colors in the visual spectrum, resulting in the color white.

Blue light can be added to red light and green light to produce the impression of white light. Solid lighting sources of different colors can be made using this principle. Most white color solid lighting sources in production today are based on the following techniques.

One technique uses three solid lighting sources respectively based on AlInGaP, GaN and GaP to emit red, green and blue light subject to the control of an electric current through AlInGaP, GaN and GaP, enabling the red, green and blue colors of light to be mixed by a lens into white light.

Another technique uses two solid lighting sources respectively based on GaN and GaP to emit blue and yellow green light subject to the control of an electric current through GaN and GaP, enabling the red and yellow green colors of light to be mixed into white light.

In either of the aforesaid two techniques, when one solid lighting source fails, no white light can be obtained. Further, because the forward bias at one solid lighting source is different from that at the other solid lighting source, multiple control circuits are necessary, resulting in a high cost. These drawbacks are unfavorable factors in actual application.

Nichia Chemical Corp. developed a white LED in 1996 by covering an InGaN blue LED with phosphor, thereby mixing blue light and down-converted yellow light to create white light. However, the continuity of the spectrum distribution of the white light thus created is unlike sunlight. This design of white LED is simply suitable for the purpose of simple illumination.

A fourth method for producing white light was developed by Sumitomo Electric Industries, Ltd., Japan. According to this technique, a ZnSe-based white LED is made by introducing an i-ZnMgBeSe/p-ZnMgSe double cladding structure, which includes a very thin i-ZnMgBeSe layer for suppressing electron overflow and a p-ZnMgSSe layer for efficient p-type carrier concentration.

SUMMARY OF THE INVENTION

The present invention has been accomplished under the circumstances in view. The invention uses a blue color of solid lighting source to match with a specially prepared yellow orange color of fluorescent light for the production of white light.

It is the main object of the present invention to provide a fluorescent powder, which uses YAG (yttrium aluminum garnet) as the substrate and cerium as the excitant, and has added thereto Tb (terbium) ions, Ga (gadolinium) ions, Yb (ytterbium) ions and Lu (lutetium) ions. The fluorescent powder absorbs short-wave radiation $\lambda=440\sim480$ nm from an InGaN semiconductor heterostructure and then radiates light of peak wavelength $\lambda=525\sim595$ nm.

It is a object of the present invention to provide the fluorescent powder has the chemical formula of $(Y_{1-x-y-z-p-q}Gd_xTb_yYb_zLu_pCe_q)_3Al_5O_{12}$.

DETAILED DESCRIPTION OF THE PREFERRED EMBODIMENT

Figure 1:
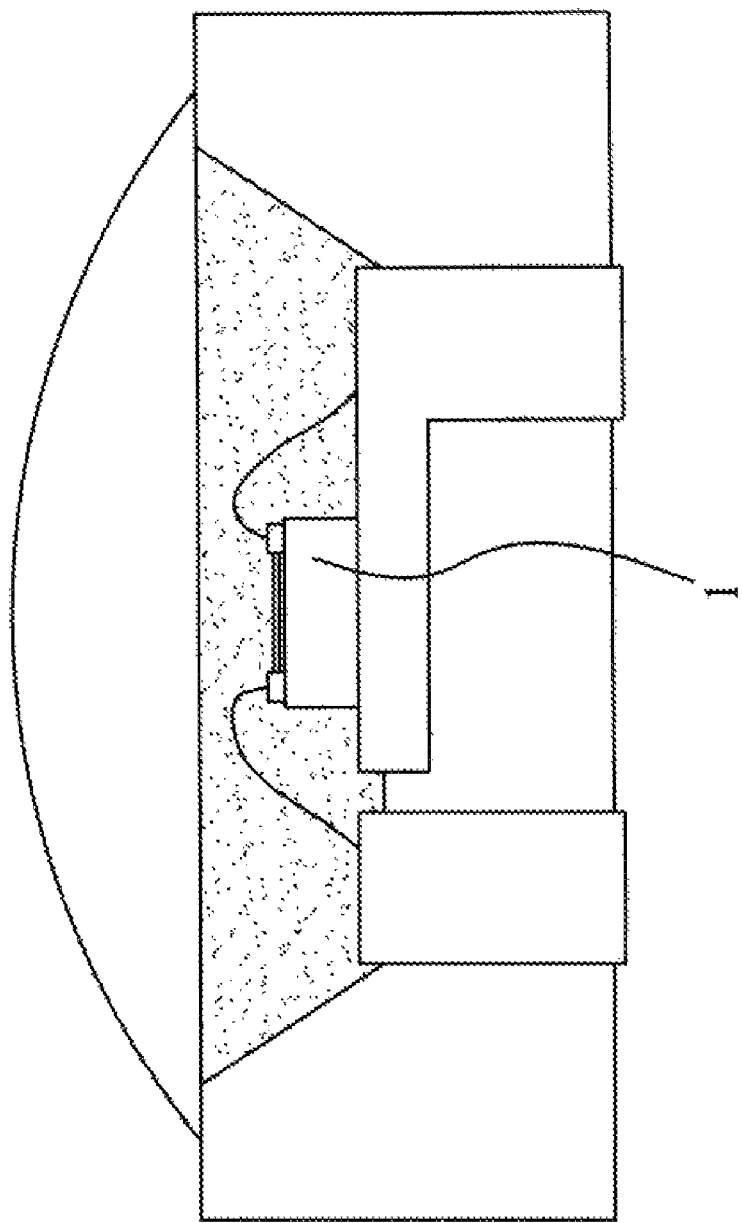
FIG. 1 a schematic structural view of a light emitting diode made according to the present invention.

A fluorescent powder for LED (light emitting diode) in accordance with the present invention can be but not limited to an inorganic fluorescent powder that uses YAG (yttrium aluminum garnet) as the substrate and Ce (cerium) as the excitant, and added with Tb (terbium) ions, Gd (gadolinium) ions, Yb (ytterbium) ions and Lu (lutetium) ions.

The substrate of the fluorescent powder is but not limited to YAG having the chemical composition of $(Y_{1-x-y-z-p-q}Gd_xTb_yYb_zLu_pCe_q)_3Al_5O_{12}$ that uses Ce (cerium) as the excitant and radiates yellow-orange light. In the chemical formula $(Y_{1-x-y-z-p-q}Gd_xTb_yYb_zLu_pCe_q)_3Al_5O_{12}$, $x=0.05\sim0.9$, $y=0.001\sim0.3$, $Z=0.01\sim0.05$, $p=0.01\sim0.2$, and $q=0.0001\sim0.2$. Preferably, the content of the excitant is $0.07 \leq Ce/(Gd+Tb+Yb+Lu) \leq 0.20$.

The concentration ratio between the active ions $Ce^{+3}$ in the fluorescent powder and the concentration of Tb, Yb and Lu ions that are added to the YAG substrate is $0.09 \leq Ce/(Tb+Yb+Lu) \leq 0.23$.

The fluorescent powder is a granulated fluorescent powder capable of absorbing short-wave radiation $\lambda=440\sim480$ nm emitted by InGaN semiconductor heterostructure 1 (see FIG. 1) and then radiating light of peak wavelength $\lambda=525\sim595$ nm in which the moving distance of the peak wave in the long-wave direction is relatively increased subject to increasing of the specific value $(Gd+Ce)/(Y+Lu+Gd+Tb+Yb+Ce)$ within $0.05\sim1$.

When the fluorescent powder is excited by the short-wave radiation of the semiconductor heterostructure 1, the afterflow luminance of the light being radiated by the fluorescent powder is relatively reduced within 120~60 nanoseconds subject to increasing of the specific value $(Gd+Ce)/(Y+Lu+Gd+Tb+Yb+Ce)$ within $0.005\sim1$.

Therefore, the fluorescent powder of the present invention has the following characteristics: It is based on the substrate of YAG (yttrium aluminum garnet), using Ce (cerium) as the excitant and having added thereto Tb (terbium) ions, Gd (gadolinium) ions, Yb (ytterbium) ions and Lu (lutetium) ions to form a compound having the chemical formula of $(Y_{1-x-y-z-p-q}Gd_xTb_yYb_zLu_pCe_q)_3Al_5O_{12}$ that absorbs short-wave radiation $\lambda=440\sim480$ nm from InGaN semiconductor heterostructure 1 and then radiates light of peak wavelength $\lambda=525\sim595$ nm in which the moving distance of the peak wave in the long-wave direction is relatively increased subject to increasing of the specific value $(Gd+Ce)/(Y+Lu+Gd+Tb+Yb+Ce)$ within $0.05\sim1$.

The fluorescent powder absorbs 20 to 90 percent of the original short-wave radiation from the semiconductor heterostructure and mixes the absorbed shortwave radiation from the semiconductor heterostructure with a yellow-orange light from the fluorescent powder, thereby forming white light of color temperature T=6500-2800K.

The present invention uses a blue color of solid lighting source, which emitted short-wave radiation λ=440~480 nm, to match with a specially prepared yellow orange color of fluorescent light, which absorbing short-wave radiation λ=440~480 nm emitted by blue color of solid lighting source 1 (see FIG. 1) and then radiating light of peak wavelength λ=525~595 nm, for the production of white light of color temperature T=6500~2800 K.

Although particular embodiments of the invention have been described in detail for purposes of illustration, various modifications and enhancements may be made without departing from the spirit and scope of the invention.

What is claimed is:

1. A fluorescent powder comprising a substrate prepared from YAG (yttrium aluminum garnet) and an excitant prepared from cerium and ions including Tb (terbium), Gd (gadolinium) ions, Yb (ytterbium) ions and Lu (lutetium) ions, said YAG (yttrium aluminum garnet) having the chemical formula of $(Y_{1-x-y-z-p-q}Gd_xTb_yYb_zLu_pCe_q)_3Al_5O_{12}$, wherein x=0.05~0.9, y=0.001~0.3, z=0.01~0.5, p=0.01~0.2, and q=0.0001~0.2.

2. The fluorescent powder as claimed in claim 1, wherein the content of active ions of said excitant to active ions of Yb, Gd, Tb, and Lu is 0.07≦Ce/(Gd+Tb+Yb+Lu)≦0.20.

3. The fluorescent powder as claimed in claim 1, wherein the concentration ratio between the active ions $Ce^{+3}$ in the fluorescent powder and the concentration of Tb, Yb and Lu active ions that are added to the YAG substrate is 0.09≦Ce/(Tb+Yb+Lu)≦0.23.

4. The fluorescent powder as claimed in claim 1, which absorbs short-wave radiation λ=440~480 nm from an InGaN semiconductor heterostructure and then radiates light of peak wavelength λ=525~595 nm in which the moving distance of the peak wave in the long-wave direction is relatively increased subject to increasing of the specific value (Gd+Ce)/(Y+Lu+Gd+Tb+Yb+Ce) within 0.05~1.

5. The fluorescent powder as claimed in claim 4, wherein when the fluorescent powder is excited by the short-wave radiation of the InGaN semiconductor heterostructure, the afterflow luminance of the light being radiated by the fluorescent powder is relatively reduced within 120~60 nanoseconds subject to increasing of the specific value (Gd+Ce)/(Y+Lu+Gd+Tb+Yb+Ce) within 0.005~1.

6. The fluorescent powder as claimed in claim 1, which absorbs 20~90% the original short-wave radiation from the semiconductor heterostructure, and mixes the absorbed short-wave radiation from the semiconductor heterostructure with a yellow-orange light from said fluorescent powder, thereby forming white light of color temperature T=6500~2800K.

* * * * *